United States Patent

Rose

[15] 3,663,319

[45] May 16, 1972

[54] MASKING TO PREVENT AUTODOPING OF EPITAXIAL DEPOSITS

[72] Inventor: John W. Rose, Kokomo, Ind.

[73] Assignee: General Motors Corporation, Detroit, Mich.

[22] Filed: Nov. 20, 1968

[21] Appl. No.: 777,368

[52] U.S. Cl. ..........148/175, 148/187

[51] Int. Cl. ..........H01l 7/36

[58] Field of Search ..........148/187, 175

[56] References Cited

UNITED STATES PATENTS

| | | | |
|---|---|---|---|
| 3,104,991 | 9/1963 | McDonald | 148/187 |
| 3,458,367 | 9/1969 | Yasufuku | 148/175 |
| 3,481,801 | 10/1969 | Hugle | 148/175 |
| 3,147,152 | 9/1964 | Mendel | 148/187 |
| 3,243,323 | 3/1966 | Corrigan | 148/187 |
| 3,260,624 | 7/1966 | Wiesner | 148/191 |
| 3,296,040 | 1/1967 | Wigton | 148/187 |
| 3,206,339 | 9/1965 | Thornton | 148/175 |
| 3,409,482 | 11/1968 | Lindmayer | 148/187 |
| 3,425,879 | 2/1969 | Shaw | 148/187 |

*Primary Examiner*—Hyland Bizot
*Attorney*—W. S. Pettigrew and R. J. Wallace

[57] ABSTRACT

A technique is disclosed for producing extremely high resistivity epitaxial deposits, particularly of P-type conductivity on low resistivity substrates. P-type epitaxial deposits of up to 50 ohm-centimeters on a 0.01 ohm-centimeter P-type substrate can be obtained by masking the back and sides of the epitaxial substrate, leaving exposed only the surface on which the epitaxial deposit is formed.

3 Claims, 5 Drawing Figures

INVENTOR.
John W. Rose
BY
R. J. Wallace
ATTORNEY

MASKING TO PREVENT AUTODOPING OF EPITAXIAL DEPOSITS

BACKGROUND OF THE INVENTION

Epitaxial deposits of semiconductive material are made by a technique which can be broadly characterized as thermal decomposition. In this technique elemental semiconductor is released at an elevated temperature from a source compound containing the semiconductor. Epitaxial deposits of N-type material can be deposited by such a technique with resistivities of 30 to 50 ohm-centimeters, on 0.01 ohm-centimeter substrates. However, no one has heretofore been able to produce P-type epitaxial deposits of even comparable resistivity on such a low resistivity substrate. High resistivity P-type epitaxial layers can be produced, but not on substrates having a resistivity of less than 0.1 ohm-centimeter. They can only be produced, and with some difficulty, on substrates having resistivities higher than 0.1 ohm-centimeter.

On the other hand, a substrate resistivity in excess of 0.1 ohm-centimeter produces a high series resistance with the devices formed in the epitaxial layer. Hence, there is a large and undesirable power dissipation that occurs. Accordingly, when one previously wanted a P-type high voltage device in an epitaxial material he inherently had to accept a large power dissipation. On the other hand, if he reduced the power dissipation by using a lower resistivity substrate, he could not obtain the higher voltage device characteristics he wanted.

P-type devices and integrated circuits made with P-type epitaxial material are desirable, among other reasons, because they can be coupled with devices and circuits made on N-type material to eliminate the necessity of transformers and the like. Hence, considerable interest has developed in the use of P-type epitaxial material. Yet, despite this interest, no one has yet been able to supply P-type epitaxial material with epitaxial layers greater than about 10 ohm-centimeters resistivity on P-type substrates of less than 0.1 resistivity.

I have now found a simple, economical, reliable and commercially practical technique for consistently producing high resistivity epitaxial deposits of P-type conductivity on low resistivity P-type substrates.

SUMMARY OF THE INVENTION

It is, therefore, a principal object of the invention to provide a new epitaxial deposition technique, which is particularly suitable for the production of high resistivity epitaxial P-type deposits on low resistivity P-type substrates.

It is a further object of the invention to provide a new substrate for epitaxial deposition which inhibits autodoping and permits one to attain higher resistivity epitaxial deposits.

It is also an object of the invention to provide an improved epitaxial material for producing higher voltage P-type semiconductive devices, including monolithic integrated circuits, with lower power dissipation.

These and other objects of the invention are accomplished by masking the epitaxial substrate prior to epitaxial deposition, leaving exposed substantially only that surface upon which the epitaxial layer is to be formed. The high resistivity epitaxial layer is then formed by depositing it at a rate in excess of the diffusion rate of the predominant impurity in the epitaxial substrate. The maskant inhibits impurities within the epitaxial substrate from autodoping the epitaxial layer, that is outdiffusing into the epitaxial atmosphere, mingling with the epitaxial gases, and contaminating the epitaxial semiconductor material as it is grown.

The epitaxial deposit formed by this invention has a relatively thick surface region of high resistivity and a relatively thin region of moderate resistivity contiguous the epitaxial substrate. Maximum voltage and minimum power dissipation characteristics are achieved when the semiconductive devices are formed wholly within the high resistivity region.

BRIEF DESCRIPTION OF THE DRAWING

Other objects, features and advantages of the invention will become more apparent from the following description of the preferred examples thereof, and from the drawing, in which.

FIGS. **1*a*–1*d*** show schematic sectional views of an epitaxial substrate during the successive steps of conventional epitaxial deposition using an oxide mask for selective deposition.

FIGS. **2*a*–2*d* show schematic sectional views of my improved epitaxial substrate through the successive steps of my improved epitaxial deposition techniques.

DESCRIPTION OF THE PREFERRED EMBODIMENTS

Figure 1A:
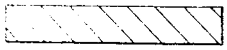
Figure 1B:
Figure 1C:
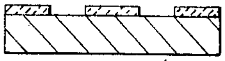
Figure 1D:
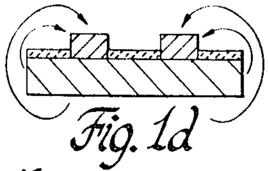

In the simplest conventional epitaxial technique (not shown) no masking at all is used. In it, a slice of higher conductivity semiconductor such as a 0.01 or 0.1 ohm-centimeter resistivity germanium or silicon is cleaned, generally on all surfaces. The slice is then placed with one face on a flat, heated support, and the epitaxial layer is deposited directly onto the exposed substrate. In such instance outdiffusion can occur from both the edge and back surfaces of the slice during epitaxial deposition.

In some instances, selective epitaxial deposition has been practiced, such as shown in FIGS. *1a–1d*. In such instance the semiconductor slice is first coated with a suitable masking layer, windows are opened up on the desired surface by photoetching techniques, and then the epitaxial deposit made onto the semiconductor surface exposed in the windows. However, in making the windows by the photoetching technique, one inherently also concurrently removes the oxide maskant from the sides and bottom of the wafer. Thus, only the top surface ends up being masked and outdiffision can occur from the back and edges, substantially as if no masking at all were present.

On the other hand, as can be seen in connection with FIGS. *2a–2da*, my preferred epitaxial substrate 10 has a protective coating 12 on the sides and back. Hence, no outdiffusion can occur from these areas to contaminate the epitaxial environment. If the slice 10 is silicon, its surface can be oxidized to provide the protective coating 12. The coating is removed from the upper surface 14 but not from the back or sides. Then the epitaxial deposit 16 is formed on the upper surface 14.

I have found that once epitaxial deposition has commenced, outdiffusion from the exposed deposition surface into the surrounding environment does not occur if the deposition rate exceeds the diffusion rate. Normal epitaxial deposition rates increase the thickness about four to five times faster than boron, for example, can diffuse through it. Hence, the impurity is not free to escape into the surrounding environment. Accordingly, the epitaxial layer itself masks the originally exposed deposition surface 14 to effectively trap the potentially contaminating impurities. However, from this limited outdiffusion, a relatively thin layer 18 of moderate resistivity forms contiguous substrate surface 14.

It has been apparently assumed that the epitaxial layer 16 was principally contaminated by the surface 14 upon which the layer was deposited. I have unexpectedly found that outdiffusion from the sides and back of the substrate not only has a significant effect on the epitaxial deposit but is apparently a principal source of epitaxial contamination.

In fact, I have unexpectedly found that I can so effectively prohibit autodoping of the epitaxial layer in my technique that certain additional controls, hereinafter described, should be observed in the epitaxial process.

Figure 3:
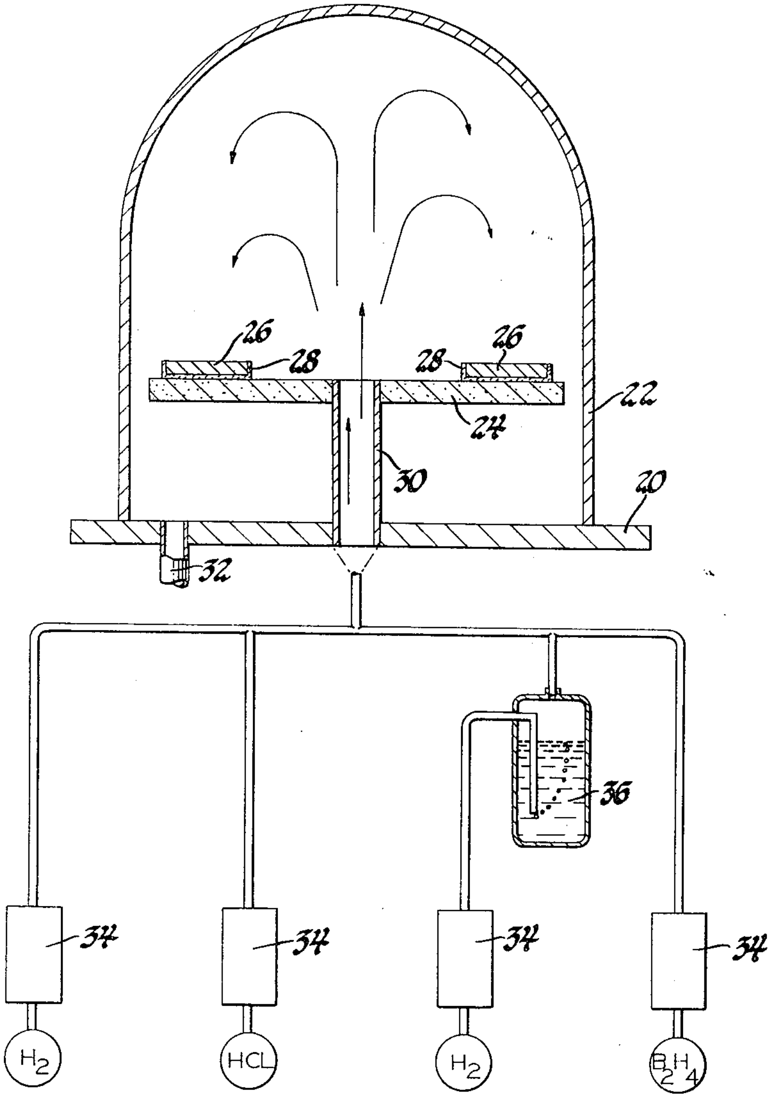
FIG. 3** shows a schematic view of a typical epitaxial apparatus, such as can be used to practice my improved epitaxial process.

In order to best describe my improved process, reference is now made to FIG. 3, which schematically shows a conventional vertical epitaxial reactor of the commercially available type. The epitaxial layer of silicon is deposited in the FIG. 3 apparatus by hydrogen reduction of silicon tetrachloride onto a heated silicon substrate. In this apparatus it should be recognized that impurity doping from the following several sources occurs: (a) about 50 ohm-centimeters N-type doping inherent to deposition from commercially available silicon tetrachloride, (b) P-type autodoping from the exposed deposition surface of the masked $P^+$ epitaxial substrate, (c) P-type autodoping from residual impurities in the epitaxial system, and (d) P-type doping from a controlled acceptor source, such as diborane gas.

The N-type impurity doping from the silicon tetrachloride is essentially constant. The P-type autodoping from the exposed surface of the $P^+$ substrates, which forms the moderate resistivity region 18 in FIG. *2d*, varies directly with deposition temperature and inversely with the deposition rate. The P-type autodoping from residual impurities in the epitaxial system is of less importance than the other three sources of impurity doping, if the system is kept clean. However, it is quite difficult to completely remove residual contamination from low resistivity depositions by the usual cleaning techniques. Hence, if I am to use a system for a high resistivity deposition after using it for a low resistivity deposition, I prefer to make one or more high resistivity depositions on sample slices first.

The P-type doping from the controlled acceptor source should be controlled to not only regulate the average impurity concentration in the epitaxial layer, but also to prevent inversion in the initially deposited material. By appropriately controlling these factors, I have readily and consistently produced 20 to 50 ohm-centimeters P-type epitaxial silicon layers on 0.008–0.005 ohm-centimeter $P^+$ polished silicon substrates.

The epitaxial reactor illustrated in FIG. 3 has a base plate 20 with a bell cover 22 which forms a closed deposition chamber. A circular graphite susceptor plate 24 supports a plurality of silicon slices 26 thereon with each slice having its sides and back masked by an enveloping silicon oxide layer 28. The graphite susceptor 24 is, in turn, supported by a tubular member 30 which also serves as a conduit for disseminating epitaxy gases into the chamber through a corresponding aperture in the susceptor plate. Means (not shown) are used to heat the susceptor plate to deposition temperature of about 1,150° to 1,200° C. Means (also not shown) can be used to rotate the susceptor plate in a horizontal plane, if desired. Base plate 20 has an exit 32 therein to exhaust epitaxy gases to maintain a continuous circulation of reactive gases at atmospheric pressure through the reactor chamber.

Gaseous sources of hydrogen chloride and diborane are connected to a common manifold, as are two separate sources of ultra pure hydrogen. The manifold is, in turn, in communication with the tubular susceptor support 30 to introduce these gases in controlled amounts into the reaction chamber. Means for monitoring and controlling the flow of each gaseous source is represented by reference numeral 34. The flow line for one of the ultra pure hydrogen sources is bubbled through a silicon tetrachloride saturator 36, to provide the semiconductor deposition source.

To make the epitaxial deposit, a silicon slice of approximately 0.008–0.005 ohm-centimeter is exposed to oxygen at an elevated temperature in the accepted manner to produce a silicon dioxide film approximately 2 micron in thickness that completely encloses the silicon wafer. The particular manner in which the oxide film is produced is not of critical importance and it can be produced by any of the normal and accepted manners, such as thermal oxidation, reactive sputtering, evaporation, or the like. Of course, while silicon dioxide is the most convenient maskant to use in connection with a silicon epitaxial substrate, other techniques for effectively isolating the edges and back surface of the slice may also be employed. As for example, it may be desirable to envelop the surface of the slice with another maskant, such as aluminum oxide, silicon nitride, silicon carbide, etc. Any material can be used as a maskant if it is impermeable to the impurities which one is trying to entrap within the epitaxial substrate. Moreover, the material can be applied by any technique which produces the desired thickness of maskant and which does not detrimentally affect the epitaxial substrate.

The maskant should be thick enough to prevent any significant outdiffusion from the epitaxial substrate. The minimum useful thickness depends upon the nature of the masking material, the nature of the impurities employed, the reactivity of the maskant with the epitaxy environment, and the epitaxy resistivity one is trying to achieve, and the like.

Generally, it is preferred that the maskant be a coating on the surface of the substrate as opposed to embedding the substrate in some large mass to prevent the practical problems incident to differences in thermal expansion between the substrate and the maskant. However, if thin films of maskant are employed differences in thermal expansion are normally not a problem. To avoid any problems in this latter connection, it is most preferred to use masking films in thicknesses which are only thick enough to insure that outdiffusion has been prevented. For silicon dioxide maskants a coating thickness of at least about 3,000 angstroms should be used when making even very thin intermediate resistivity epitaxial films. However, silicon dioxide reacts somewhat with the epitaxy environment and the coating tends to degrade. Hence, it is desirable to employ somewhat thicker silicon dioxide films as, for example, at least 5,000 angstroms when one is producing somewhat thicker epitaxial layers. I prefer to use silicon dioxide thicknesses of about 8,000 to 10,000 angstroms when depositing a 0.5 mil epitaxial layer.

One major surface of the enveloped wafer is then carefully mechanically polished to remove the oxide film from that surface without removing the oxide film from either the edges or opposite major surface of the wafer. The oxide can also be removed by etching techniques, such as by embedding the wafer in an appropriate wax, leaving exposed only one major surface, and then exposing that surface to hydrofluoric acid. The edges and back can also be masked for etching by a photo-resist material but this requires more elaborate techniques.

Once the oxide film has been removed from the surface onto which the epitaxial layer is to be deposited, that surface must be cleaned to prepare it for epitaxial deposition. Cleaning is performed in the conventional manner, as with successive washes of trichloroethylene, ethyl alcohol, acetone, nitric acid and deionized water. Once cleaned, the epitaxial substrate is placed on the graphite susceptor, with the cleaned face up, and the bell housing 22 put in place on the base plate 20.

The deposition chamber is then purged of atmospheric gases. Purging can be facilitated, of desired, by first evacuating it and then backfilling with dry argon, if desired. Means for doing so are not shown since they are not significant to the apparatus for purposes of this invention. A steady flow of the ultra pure dry hydrogen is then started through the chamber to produce a hydrogen atmosphere. A flow of about 12 liters per minute of hydrogen is usually satisfactory and this flow should be maintained throughout the process. Heating of the susceptor plate 24 to a temperature of approximately 1,200° C. is then commenced. Once the susceptor plate temperature has stabilized, the hydrogen chloride is bled into the system to etch the wafer surface. Etching, of course, removes minor surface imperfections in the substrate, such as might be caused by polishing and the like.

After etching, the bleed of hydrogen chloride in the system is discontinued and the system allowed to stabilize, while still maintaining the flow of hydrogen into the reaction chamber. A small flow of diborane is then started into the system. After several minutes, the second source of ultra pure hydrogen is then bubbled through the silicon tetrachloride saturator and introduced into the deposition chamber.

Sufficient diborane is bled into the system to over-compensate the inherent N-type conductivity of the epitaxial deposit and reduce it to a resistivity of about 20 to 50 ohm-centimeters P-type conductivity. The rate of diborane introduction, of course, determines the ultimate resistivity of the epitaxial layer. Hence, one should vary the rate of diborane flow to obtain the desired resistivity. For the present example, a flow of 20 cubic centimeters per minute was used.

This technique is so effective in prohibiting autodoping that unless one achieves a good mixing of the diborane in the bell jar before deposition commences, an N-type deposit may initially be formed. One can avoid producing an N-type region in the initial deposition by introducing the diborane into the system 5 minutes or so before introducing the silicon tetrachloride. He can also do so by growing the epitaxial layer more slowly at first, so that the substrate diffusion layer can ultimately overcompensate any N-type region initially formed. One can grow the deposit more slowly by regulating either or both the susceptor temperature and the silicon tetrachloride concentration. I prefer to use a constant growth temperature of about 1,200° C and, instead, vary just the silicon tetrachloride concentration. For example, I start with a flow of only 0.1 liter per minute of hydrogen through the silicon tetrachloride saturator and gradually accelerate the flow during the next 20 minutes, at 5 minute intervals, to 0.6 liter per minute. The saturator is preferably held at a temperature of 0° C. This final rate of flow is sufficient to deposit the epitaxial layer at a rate of about 0.5 micron per minute.

For the balance of the deposition, a growth rate in excess of the diffusion rate of the substrate impurity should be used. Impurities such as boron will not diffuse more than 0.1 mil in the time required to deposit the first 0.5 mil under the conditions herein described. It diffuses further an even lesser proportional distance for additional thicknesses deposited because these additional thicknesses do not include the deposition start-up time. Hence, it is possible to obtain rather thick, high resistivity regions. After the desired epitaxial layer thickness is obtained, flow of the silicon tetrachloride saturated hydrogen is stopped, heating of the graphite susceptor is terminated, the system allowed to cool, and the deposition chamber is opened to remove the coated substrates.

To illustrate the reduction in autodoping achieved in accordance with this invention by a silicon dioxide mask, three wafers masked as follows were identically processed:

Water No. 1 — 0.005 ohm-centimeter $P^+$ polished silicon wafer with no silicon dioxide masking.

Wafer No. 2 — 0.005 ohm-centimeter $P^+$ polished silicon wafer with silicon dioxide masking on the back only.

Wafer No. 3 — 0.005 ohm-centimeter $P^+$ polished silicon wafer with silicon dioxide masking on the back and edges.

The resistivities of the P-type epitaxial layers deposited on these three wafers were:

Wafer No. 1 — 8 ohm-centimeter epitaxial deposit

Wafer No. 2 — 18 ohm-centimeter epitaxial deposit

Wafer No. 3 — 24 ohm-centimeter epitaxial deposit

Figure 2A:
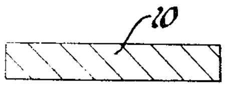
Figure 2B:
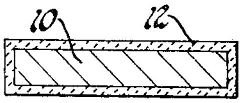
Figure 2C:
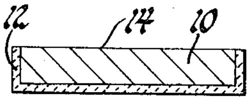
Figure 2D:
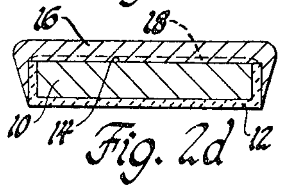

As can be seen from the above illustration, a significant reduction in autodoping is achieved by masking only the back of the wafer. However, the largest reduction in autodoping is produced when both the back and the edges of the $P^+$ substrate are masked with silicon dioxide. Moreover, as can be seen in connection with FIG. 2*d*, the edges of the substrate tend to build up an epitaxial deposit too. Hence, it is far more important to coat the back of the slice than the edges. If the ultimate benefits of the invention a re not desired, it may not even be necessary to mask the edges.

Moreover, this technique can also be used to obtain more precise control of even lower resistivity depositions. The autodoping effect is not constant in time or uniform across a slice during epitaxial deposition. Hence, one must attempt to override this variability by heavily doping the epitaxial deposit. Nonetheless, this variation frequently cannot sufficiently be obscured. My invention provides a means for doing so. Thus, it is useful in making low resistivity depositions too.

It is, therefore, to be understood that although this invention has been described in connection with certain specific examples thereof, no limitation is intended thereby except as defined in the appended claims.

I claim:

1. A process for epitaxially depositing a precisely controlled resistivity layer of boron doped silicon onto a low resistivity boron doped silicon substrate wafer, said process comprising the steps of masking substantially all surface portions of said substrate wafer with a coating that will inhibit outdiffusion of boron from said wafer during epitaxial deposition, uncovering only a selected surface portion of said wafer upon which epitaxial deposition is desired, exposing the wafer to an epitaxial deposition environment containing a thermally decomposable source of silicon and a source of boron of predetermined concentration uniformly dispersed therewith, heating said wafer in said environment to an epitaxial deposition temperature, epitaxially depositing onto said uncovered wafer surface a first thickness of an epitaxial layer at a first rate, said first deposition rate not being significantly in excess of the rate at which boron diffuses out from the uncovered wafer surface into the epitaxial layer deposited on it, thereafter epitaxially depositing a second thickness of said epitaxial layer at a second rate, said second rate being faster than the first and significantly in excess of the boron diffusion rate, and continuing said second deposition rate until it forms a major proportion of said epitaxial layer.

2. A process for epitaxially depositing a precisely controlled resistivity layer of P-type silicon onto a low resistivity P-type silicon substrate wafer, said process comprising the steps of masking substantially all surface portions of said substrate wafer with a coating that will inhibit outdiffusion of P-type impurity from said wafer during epitaxial deposition, uncovering only a selected surface portion of said wafer upon which epitaxial deposition is desired, exposing the wafer to an epitaxial deposition environment containing a thermally decomposable source of silicon and a predetermined concentration of a P-type impurity uniformly dispersed therewith, heating said wafer in said environment to an epitaxial deposition temperature, epitaxially depositing onto said uncovered wafer surface a minor proportion of the thickness of an epitaxial layer at a first rate, said first deposition rate not being significantly in excess of the rate at which the wafer P-type impurity diffuses out from said uncovered wafer surface into the epitaxial layer deposited on it, thereafter epitaxially depositing a major proportion of the thickness of said epitaxial layer at a second rate, said second rate being faster than the first and significantly in excess of the wafer impurity diffusion rate, maintaining said epitaxial deposition temperature constant for both rates of deposition, and adjusting the concentration of the silicon source to regulate the rate of deposition.

3. A process for epitaxially depositing a layer of P-type silicon the major thickness of which has a resistivity of at least about 20 ohm-centimeters onto a P-type silicon substrate wafer having a resistivity of less than about 0.01 ohm-centimeter, said process comprising the steps of masking substantially all surface portions of said substrate wafer with a coating that will inhibit outdiffusion of said P-type impurity from said wafer during epitaxial deposition, uncovering only a selected surface portion of said wafer upon which epitaxial deposition is desired, exposing the wafer to an epitaxial deposition environment containing a thermally decomposable source of silicon and a predetermined concentration of a P-type impurity uniformly dispersed therewith, heating said wafer in said environment to an epitaxial deposition temperature, epitaxially depositing onto said uncovered wafer surface a minor thickness of an epitaxial layer at a first rate, said first deposition rate not being significantly in excess of the rate at which the wafer P-type impurity diffuses out from the uncovered wafer surface into the epitaxial layer deposited on it to produce an intermediate resistivity portion of said epitaxial layer between said substrate and said major thickness, thereafter epitaxially depositing a second thickness of said epitaxial layer at a second rate, said second rate being faster than the first and significantly in excess of the wafer impurity diffusion rate, and continuing said second deposition rate until it forms a major proportion of said epitaxial layer.

* * * * *